US007594208B1

(12) United States Patent
Borer et al.

(10) Patent No.: US 7,594,208 B1
(45) Date of Patent: *Sep. 22, 2009

(54) TECHNIQUES FOR AUTOMATED SWEEPING OF PARAMETERS IN COMPUTER-AIDED DESIGN TO ACHIEVE OPTIMUM PERFORMANCE AND RESOURCE USAGE

(75) Inventors: Terry Borer, Toronto (CA); Ian Chesal, Toronto (CA); James Schleicher, Santa Clara, CA (US); David Mendel, Sunnyvale, CA (US); Mike Hutton, Mountain View, CA (US); Boris Ratchev, Sunnyvale, CA (US); Yaska Sankar, San Jose, CA (US); Babette van Antwerpen, Mountain View, CA (US); Gregg Baeckler, San Jose, CA (US); Richard Yuan, Cupertino, CA (US); Stephen Brown, Toronto (CA); Vaughn Betz, Toronto (CA); Kevin Chan, Scarborough (CA)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/610,392

(22) Filed: Dec. 13, 2006

Related U.S. Application Data (63) Continuation of application No. 10/625,505, filed on Jul. 22, 2003, now Pat. No. 7,181,703.

(51) Int. Cl.
*G06F 17/50* (2006.01)
*G06F 9/45* (2006.01)

(52) U.S. Cl. .................... 716/5; 716/4; 716/6; 716/18; 703/13; 703/14

(58) Field of Classification Search ................. 716/1–6, 716/18; 703/13, 14
See application file for complete search history.

(56) References Cited

U.S. PATENT DOCUMENTS 4,882,690 A    11/1989    Shinsha et al.

(Continued)

OTHER PUBLICATIONS

Hutton, "Characterization and Automatic Generation of Benchmark Circuits," Ph.D.Thesis, University of Toronto, chapters 1-3 (1997).

(Continued)

*Primary Examiner*—Thuan Do
*Assistant Examiner*—Nghia M Doan
(74) *Attorney, Agent, or Firm*—Townsend and Townsend and Crew LLP (57) ABSTRACT

Techniques for optimizing the placement and synthesis of a circuit design on a programmable integrated circuit are provided. The performance of a circuit design is analyzed after it has been compiled with different values for selected input parameters. The input parameter values that produce the best results for an output metric are then chosen to synthesis and place the circuit design on the programmable integrated circuit. In one embodiment, the values of the output metrics are averaged for all test compiles that share the same input parameters, but different seeds. In another embodiment, the compile with the best output metrics, as determined by the user, are selected. These techniques allow a user to automatically trade off compile-time to get a better-optimized circuit.

31 Claims, 5 Drawing Sheets

U.S. PATENT DOCUMENTS

| | | | |
|---|---|---|---|
| 5,550,839 A * | 8/1996 | Buch et al. ............... 714/724 |
| 6,026,226 A | 2/2000 | Heile et al. |
| 6,308,313 B1 | 10/2001 | Lakshminarayana et al. |
| 6,434,729 B1 * | 8/2002 | Alpert et al. ............... 716/6 |
| 6,446,239 B1 | 9/2002 | Markosian et al. |
| 6,449,761 B1 | 9/2002 | Greidinger et al. |
| 6,651,235 B2 * | 11/2003 | Dai et al. ............... 716/7 |
| 6,691,286 B1 | 2/2004 | McElvain et al. |
| 6,721,924 B2 | 4/2004 | Patra et al. |
| 7,134,100 B2 * | 11/2006 | Ravi et al. ............... 716/2 |
| 7,181,703 B1 | 2/2007 | Borer et al. |
| 7,370,295 B1 * | 5/2008 | Chesal et al. ............... 716/2 |
| 7,454,324 B1 * | 11/2008 | Seawright et al. ............... 703/14 |
| 2003/0229728 A1 | 12/2003 | Hodges |
| 2004/0261052 A1 | 12/2004 | Perry et al. |

OTHER PUBLICATIONS

Karchmer et al. sweeper.tcl version 2.3 beta, Altera Corporation San Jose, CA (2002).

"Introduction to Quartus.RTM. II," product information Altera Corporation San Jose, CA (2003).

* cited by examiner

TECHNIQUES FOR AUTOMATED SWEEPING OF PARAMETERS IN COMPUTER-AIDED DESIGN TO ACHIEVE OPTIMUM PERFORMANCE AND RESOURCE USAGE

The present application is a continuation application of, and claims priority to, U.S. Non-Provisional application Ser. No. 10/625,505, filed on Jul. 22, 2003, now issued U.S. Pat. No. 7,181,703, which is hereby incorporated herein by reference.

BACKGROUND OF THE INVENTION

The present invention relates to techniques for design-specific tuning of computer aided design algorithms, and more specifically, to techniques for optimizing the placement and synthesis of a circuit design on a programmable integrated circuit by comparing the performance of the circuit design in response to different values for selected input parameters and choosing the input parameter values with optimum results on a circuit by circuit basis.

User constraints may include timing and resource usage constraints. Timing constraints, for example, can include the speed of the circuit measured as the maximum frequency of the longest delay path or the worst-case slack. Resource usage constraints include the layout area of a circuit design, use of interconnect or programmable switches, or power consumption.

A compilation tool can implement a circuit design and output data indicating the speed and the resource usage of a circuit design. Quartus II is an example of a prior art circuit compilation tool that is used to program programmable integrated circuits such as a field programmable gate array (FPGAs) or complex programmable logic devices (CPLDs). Quartus II analyzes a user circuit design and outputs data that characterizes the operation of the circuit including the speed and the resource usage of the layout.

FPGAs (such as Altera's Stratix family of products) typically include rows and columns of programmable circuit elements connected by a programmable interconnect network. FPGAs can be instantiated to perform a variety of user functions (designs or circuits).

An example of a programmable circuit element is a logic element, which may contain a look-up table or product-term, possibly a register, and some support circuitry for arithmetic and other special-purpose hardware functions. An FPGA can be configured according to a user circuit design by programming the logic elements, routing resources, and any other programmable circuit elements using technologies such as SRAM, EPROM, FLASH or antifuse cells manufactured on the device for this purpose.

The implementation of a circuit design, often originating with the designer in Verilog, VHDL or schematic, into a physical circuit is typically done with a series of computer-aided design (CAD) tools. This flow is often called compilation. Some elements of this tool flow include synthesis, which converts the behavioral description of a circuit into a netlist of optimized gates targeting the appropriate device, placement and routing (herein called "fitter") to choose physical locations and wires for implementing the circuit, and timing analysis that computes the expected delay of logic elements and interconnect elements to determine the potential clock-speed or maximum frequency ($F_{max}$) of the circuit.

Some fitter algorithms may begin by placing a user circuit design with a random initial solution. There are numerous random placement solutions, and the choice of starting point can affect the placement quality significantly.

There are numerous input parameter settings in compilation placement and routing that effect output metrics (e.g., speed and resource usage) of a circuit. Similarly, there are numerous opportunities for parameterization in the synthesis portion of the CAD flow; for example, turning on or off various algorithms and techniques, or modifying constant parameters. Many such input parameters or techniques are chosen as defaults in the CAD flow, because they are appropriate for the majority of potential circuits provided to the tool. However, for an individual circuit, it is common that one or more of these techniques will perform better on that circuit with a non-default parameterization.

Therefore, it would be desirable to provide techniques for optimizing numerous parameter settings that effect the placement and synthesis of a user circuit design and specifically on a programmable integrated circuit.

BRIEF SUMMARY OF THE INVENTION

The present invention provides techniques for optimizing the compilation of a circuit design. The present invention compares the performance and resource usage of a circuit design after it has been compiled with different values for selected input parameters. The input parameter values that produce optimum values for an output metric are then chosen to synthesize and place the circuit design on the programmable integrated circuit.

According to a particular embodiment of the present invention, a circuit design for a programmable circuit can be automatically compiled using multiple random starting placements, or seeds. All seed values are random, and there is no best seed for a circuit design. The results of the compilations can be averaged together to reduce noise, i.e. to reduce the error in the measurement and make the results more accurate.

According one embodiment to the present invention, selected input parameter values that produce an optimum value for one or more output metrics are determined after compiling the circuit design using multiple values for the input parameters. In this embodiment, multiple values are selected for these input parameters. The circuit design is compiled using combinations of the different values applied to the set of input parameters (herein denoted a "configuration"). Output metric values are computed for each set of input parameter values. The set of input parameter values that produces an optimum value for the output metric is displayed or identified.

According to an embodiment of the present invention, selected input parameter values that produce the optimum average or best-case values for one or more output metrics or combination of metrics are determined after compiling the circuit design using multiple values for the input parameters. In this embodiment, multiple values are selected for a set of input parameters. The circuit design is compiled using multiple values for each set of input parameter values.

According to one embodiment of the present invention, the searching mechanism exhausts all possible combinations of selected input parameters. According to another embodiment this search is organized heuristically, with a stopping criteria based on a given level of success (e.g. achievement of a desired target circuit Fmax or resource usage). In a further embodiment, the tool can choose to stop upon determining that the desired target is unattainable. These possibilities are denoted herein by the term "stopping criteria."

Average or other statistical values for one or more output metrics can be computed for each set of non-seed input parameter values. The input parameters that correspond to the optimum average output metric values can be selected to be the "characteristic" configuration of the circuit. Additional compilations can use this characteristic input parameter value set to achieve optimum performance in a single compilation.

The results displayed by the method allow a user to see the effect of various input parameters, and learn the trade-off between the various input settings. Often settings that increase the speed of a design make the design bigger and slower to compile. This embodiment allows a user to see this tradeoff and choose the preferred input parameter settings for their purposes.

Other objects, features, and advantages of the present invention will become apparent upon consideration of the following detailed description and the accompanying drawings, in which like reference designations represent like features throughout the figures.

DETAILED DESCRIPTION OF THE INVENTION

The present invention includes techniques for optimizing the compilation of a circuit design on a programmable integrated circuit. According to the techniques of the present invention, a circuit design for an FPGA or ASIC circuit is automatically compiled several times with different values for multiple input parameters. The values of one or more output metrics, indicative of the operation of the resulting circuit implementation, are calculated for each compilation configuration.

The values of the output metric can be analyzed for subsets of the compilations that used the same value for at least one of the input parameters. The circuit design can be synthesized and placed using the input parameter values that provide an optimum value for the output metric.

According to the principles of the present invention, an output metric can be any circuit parameter that a user wishes to optimize or track. For example, the output metric can be the speed of the configured circuit (e.g. cycle time in MHz). Delay can be measured by time it takes for a signal to travel along the longest register-to-register path in the placed user circuit. The inverse of this time is the maximum frequency (Fmax) or speed of the user circuit. As another example, the output metric can be the timing of input/output (I/O) signals in the user circuit design.

As another example, the output metric can be the resource usage of the implementation: number of logic cells, memories, arithmetic elements, literals, or dedicated hardware that the user design uses on the programmable integrated circuit. The output metric can also be the smallest device that the user design will fit into, or other metrics such as power consumption. Typically, a user wants to reduce resources consumed by the implementation. An output metric can also be simply "success" which is measured by the implementation meeting all constraints on timing and resource usage, or partial success such as a count of the number of failing constraints.

Further output metrics can include: the minimal slack of one or more critical paths in the circuit, the number of paths which have negative (failing) slack values, the number of failing constraints, the number of compilations executed, or the total compile time exhausted thus far in the search. It can be appreciated that many more complicated output metrics involving combinations of the above, possibly with weighting coefficients, can also be defined in most embodiments of the method.

Slack indicates the timing delay in the most critical path for a given constraint in the circuit design, i.e. the constrained delay less the actual delay. Appropriate definitions of slack can take into account timing delays introduced by off-chip sources into a configured FPGA. Min-slack can be defined as a metric that includes all clock domains, and all I/O timing. Fmax represents the longest path of the slowest clock domain. The slack value of delay to a connection indicates the most critical signal on the design. This most critical signal on the design is not necessarily on the slowest clock domain. Slack is usually expressed in nanoseconds (ns) or picoseconds (ps), while fmax is usually in MHz.

Although the present invention is discussed primarily in the context of programmable logic, and FPGAs in particular, it should be understood that the principles of the present invention apply equally to other programmable integrated circuits such as programmable logic arrays (PLAs), programmable gate arrays, and programmable logic devices (PLDs). The techniques of the present invention also apply to application specific integrated circuits (ASICs) and other circuits, and to a large variety of tools that perform automatic synthesis, placement, routing and other operations on such circuits.

According to the present invention, multiple input parameters can be swept with different values during a set of compilations in order to identify the input parameter values that provide an optimum output metric value. Numerous types of input parameters can be swept during a set of compilations. Some of the input parameters that can be swept during the compilations are now discussed.

One input parameter that can be swept during the compilations is the seed value for placement. A seed value refers to a randomly defined initial placement of the user circuit design. Since the problem of placement is one of many known NP-Hard problems in CAD, a person skilled in the art can appreciate that this behavior of multiple results from the same algorithm with differing random starting points is characteristic of many efficient solutions. The fitter tool can begin to place a user circuit design at numerous initial solutions on the target device. The seed parameter is used to increase noise in the first embodiment of the present invention, when the tool is simply looking for the best possible output metrics and is not concerned with average values. In another embodiment, the seed parameter is used to reduce noise when calculating the average value of the output metrics, which is when the "characteristic" or "signature" of a design is found.

Seeds are generally random, so the method does not need to output a particular seed value. Being random, some seeds provide better output values than others. But if any of the other parameters change, then you are not guaranteed to have that "better" seed value be good again. Useful, however, is the average result over a series of random seeds, because this gives information on the variability of the changes due to other parameters. Contrast that with the other parameters, where if the circuit-design changes (or anything else), a better result is usually achieved. We distinguish input parameters such as seed that introduce random fluctuations in the results from those which are general characteristics of the current input circuit by denoting the latter as "persistent" characteristics or parameters, and the set of such persistent parameters for a given circuit as the circuit's overall characteristic or signature.

Another input parameter, useful specifically for FPGAs, that can be swept during test compilations is the register packing parameter, which refers to the aggressiveness level for register packing. The register packing parameter can have two or more values. For example, in off mode, the register-packing feature is disabled so that no register packing occurs during the placement of the user design.

The register packing parameter can also have a default mode. In default mode, only circuit elements that match a normal template are combined into one logic element. A normal template can refer to a look-up table (LUT) and a register, where the output of the LUT is coupled directly to the data input of the register.

In default mode, LUTs and registers that are coupled together according to the normal template are identified after the user circuit design has been synthesized. Each register and LUT that matches the normal template is combined into one logic element before the user circuit design is placed onto the programmable integrated circuit. Combinations are not performed if any design rules are violated.

The register packing parameter can also have an area aggressive mode. In area aggressive mode, circuit elements that match normal templates and other templates are combined into one logic element. Examples of other templates that can be combined in area aggressive mode include registers that are coupled directly to memory elements, input/output circuit elements, or digital signal processing elements.

Another template that can be combined in area aggressive mode is the Q feedback template. In this template, the Q output of a register is fed back into the input of a LUT. Another template that can be combined in this mode is the lonely register template. This template includes a LUT and register that are not necessarily coupled together directly. Unlike seed, register packing is considered to be a persistent input parameter.

Another input parameter that can be swept during the test compilations is the fitter effort level. The fitter effort level, or "inner number" is the amount of time that the fitting tool (e.g., Quartus) devotes to compiling the user circuit design once the user circuit design has been synthesized. Effort level is also considered to be a persistent parameter.

The compilation time can be increased to allow more time for the compilation tool to fit the user circuit design. Alternatively, the compilation time can be decreased to allow less time for the compilation tool to test the user circuit design. For example, the compilation time can be doubled, quadrupled, or cut in half to vary this particular input parameter. For example, Quartus II has a fast-fit setting that cuts compilation time considerably, at the cost of circuit speed.

Another set of input parameters that can be swept during the test compilations are referred to as netlist optimizations. Netlist optimizations allow the compiler to modify the structure of a user circuit design by altering the netlist to improve the overall operation of the circuit design (e.g., faster or smaller). In general, the modifications do not change the essential functions of the circuit design.

Thus, netlist optimization has advantages and disadvantages. The netlist optimization can be an input parameter that is swept during the test compilations. As an input parameter, a netlist optimization can be turned on or turned off. When the parameter turned on, the netlist optimization algorithm modifies the user circuit design during compilation to make the design better. When the parameter is turned off, the netlist optimization algorithm does not operate during compilation. Netlist optimizations algorithms are well-known to those of skill in the art.

One type of netlist optimization that can be performed is referred to as retiming. According to retiming techniques, registers are moved through the logic in a user circuit to reduce the maximum delay of the user circuit. Retiming does not cause the operation of the user circuit to change, but does modify registers.

Another type of netlist optimization that can be performed is referred to as unmapping. A netlist identifies registers, LUTs, and other FPGA elements that can implement a user circuit design. In some instances, a previous tool in the flow may generate a mapped netlist that is not optimized, or not completely optimized according to a desired output metric (e.g., speed, layout area, etc.).

According to unmapping techniques, the non-optimum netlist is converted back into the logic gates (e.g., AND and OR gates) that represent the user circuit design. The logic gates are then synthesized back into a netlist (including registers and LUTs) using techniques that optimize a desired output metric.

An unmapping netlist optimization parameter can have several possible values when swept according to the techniques of the present invention. For example, the unmapping input parameter can be turned off entirely, in which case the original netlist is maintained. As another example, the unmapping input parameter can be turned on to optimize the speed of the user circuit. As yet another example, the unmapping parameter can be turned on to optimize the layout area of the user circuit.

As can be appreciated by one knowledgeable in the synthesis field, there is a wide range of input parameters associated with the optimization steps of synthesis. Some examples include the choice of synthesis optimization "scripts", the order in which optimization steps are applied, alternative inference templates or algorithms for high-level structures such as barrel shifters, crossbars, multiplexors, arithmetic and finite-state machines, aggressiveness parameters for timing vs. area tradeoff, carry or cascade chain extraction and duplicate fanout extraction.

Many such algorithms come with effort parameters that indicate the degree to which a search space can be expanded. For example, observability or satisfiability don't care calculation or functional decomposition and re-implementation can be expensive in computation time, but also yield significant optimization improvements. As previously mentioned, it should be appreciated that synthesis is also an NP-Hard problem, and thus a tradeoff between compile time and quality of results is always present. It should be further appreciated that the present invention seeks to exploit this inherent tradeoff: by determining the persistent parameter settings to these expensive operations, we can determine at one point in time whether the optimization is useful for further compilations, thus amortizing the cost across the many compiles that a typical design incurs in its life-cycle.

The present invention also includes techniques for allowing a user determine how much a user circuit changes in response to netlist optimizations. For example, a user can have the ability to turn off the netlist optimization entirely so that it is not used at all. As another example, a user can specify that only LUTs can be changed (not registers). Alternatively, a user can specify that LUTs and registers can be changed during a netlist optimization. As an additional alternative, a user can also specify that any netlist optimizations can be made (including retiming changes). These are examples of refined methods of specifying user constraints on the searching mechanism used in the present invention.

Specifically with reference to synthesis and technology mapping for LUT-based FPGAs, there are a number of parameters appropriate for the technology-mapping algorithm. Some of these include the "k" value (or base LUT-size target) for technology mapping, and the degree of balancing (tradeoff of larger and smaller LUTs). These are important for FPGA architectures which allow for LUT packing or which provide special purpose hardware for combining smaller LUTs to form larger ones.

As there are for synthesis, a wide variety of input parameterizations are applicable for controlling placement and routing. Some of these, such as parameterized cost of horizontal and vertical wires and soft limits on cluster inputs, are specifically appropriate to placement for FPGAs. Others, such as white-space left on the chip area during placement, are specifically appropriate to ASIC tools.

Further embodiments of the present invention are now discussed. Embodiments of the present invention can utilize any or all of the input parameters and the output metrics discussed above. The parameters discussed herein are merely illustrative and are not intended to limit the scope of the present invention.

Many tools such as Quartus II do not accept compilation time or level of netlist change allowed, as input parameters. Compilation time, area, and speed are output metrics generated by Quartus II. Other output metrics include the number of failing constraint domains, failing timing paths, and failing pairs of registers for timing. According to one embodiment of the present invention, a program referred to as "design space explorer" (DSE) acts as an interface to a compilation tool such as Quartus II. The DSE program can perform numerous compilations of a circuit design for an FPGA using Quartus II. After each compilation, the DSE checks the total compilation time, number of failing paths, signal speed, and/or design area, or other optimization criteria to determine if the user goals are met. The DSE can vary standard input parameters to Quartus II such as seed and register packing to optimize particular output metrics listed above according to user-specified goals. The tool can also choose to continue or stop based on various stopping criteria.

According to another embodiment of the present invention, a circuit design for an FPGA is test compiled to optimize values for selected input parameters. The circuit design can be a design that is specified by a user or a benchmark design selected by an FPGA manufacturer.

The circuit design is compiled several (perhaps many) times. Each compilation uses multiple sets of input parameter values including, for example, multiple seed values and placement effort level. Only one value for each input parameter can be used in each individual compilation.

According to this embodiment of the present invention, the software automatically sweeps (varies) at least one of the input parameters between compilations. For example, different values for seed can be used in multiple compilations.

A compilation tool provides values for one or more output metrics for each of the test compilations. One of the output metrics can be, for example, speed measured by the maximum frequency Fmax (MHz) of the longest path. Table 1 shown below illustrates how values for an output metric (maximum frequency) change when the input parameters for seed, register packing, and inner number are swept over multiple values.

TABLE 1

| Compilation | Seed | Register Packing | Inner Number | Maximum Frequency |
|---|---|---|---|---|
| 1 | 1 | ON | 1 | 80 |
| 2 | 1 | ON | 3 | 82 |
| 3 | 1 | OFF | 1 | 78 |
| 4 | 1 | OFF | 3 | 84 |
| 5 | 2 | ON | 1 | 79 |
| 6 | 2 | ON | 3 | 87 |
| 7 | 2 | OFF | 1 | 81 |
| 8 | 2 | OFF | 3 | 86 |
| 9 | 3 | ON | 1 | 80 |
| 10 | 3 | ON | 3 | 85 |
| 11 | 3 | OFF | 1 | 76 |
| 12 | 3 | OFF | 3 | 82 |

The compilations such as the ones shown in Table 1 are performed for each seed value. The compilation tool outputs, for example, the maximum frequency for each compilation. One or more input parameters values are swept during the compilations. For example, in the example of Table 1, the input parameters seed, register packing, and inner number are swept over multiple values in 12 compilations.

As another example, just one input parameter (e.g., seed) can be changed in each compilation, while other input parameter values are held constant. As another example, two, four, five or any number of input parameters is swept over multiple values. One value for each input parameter is used in each compilation. Therefore, if seed is swept over 6 values, then at least 6 compilations must be performed.

The results for the selected output metrics that most closely match a user's requirements are then displayed. For example, the greater values for $F_{max}$ can be displayed along with the input parameter values that provided this greater $F_{max}$ value. In the example shown in Table 1, the input parameter values for test compilation 6 are identified as producing the greatest value for the maximum frequency of the longest delay path.

As another example, a system of the present invention can generate a graph that illustrates the trade-offs between sweeping various input parameters. The graph can show how changing values of an input parameter can affect one more output metrics. A user can manually select the best compilation for his purposes based on the information provided about how the output metric values change in response to changes in selected input parameter values. The selected compilation is referred to as the signature or characteristic of a design, and it represents preferred input settings for all persistent input parameters. The user can then select the input parameter settings corresponding to the signature compilation for future compiles. The results generated for the signature compilation are often representative of future compiles.

Figure 1:
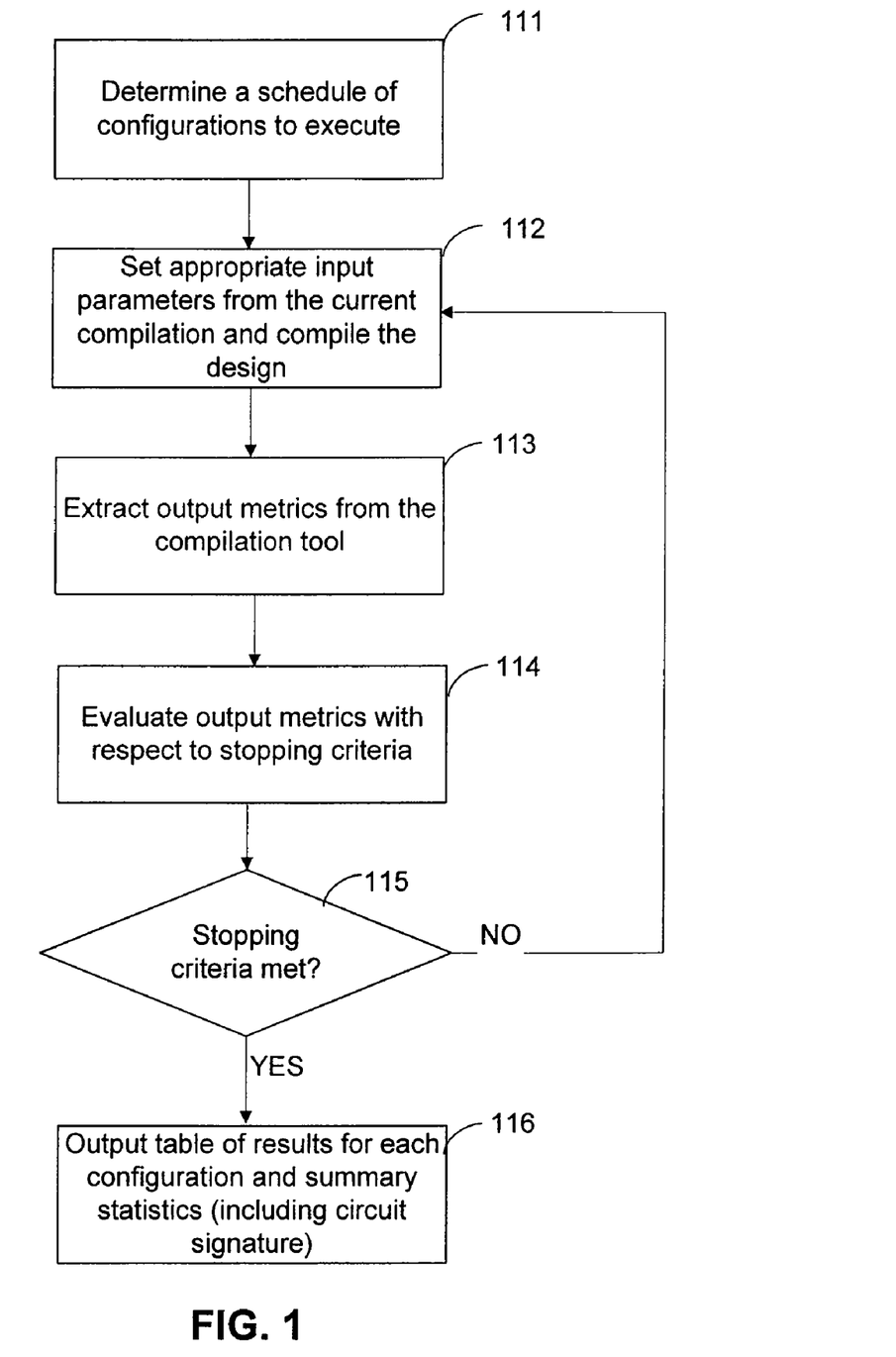
FIG. 1 is a flow chart illustrating a process for sweeping a set of input parameters, measuring a set of output metrics and reporting the optimal configuration or table of results for all configurations, controlled by a stopping criteria.

FIG. 1 illustrates a process of the present invention. At step 111, a computer system computes a schedule for multiple compilations of a circuit design using a series of values for each input parameter in a set of input parameters to generate values for an output metric. One configuration of parameter values is applied at 112, and the design compiled subject to that configuration at 113. Output metrics are extracted from the compilation tool at 114. The stopping criteria is evaluated, and the process either ends at 116 if the criteria is met, otherwise returns to 112 for the next configuration. The compilations shown in Table 1 are illustrative of the final results of this process on a specific example. The process of obtaining the stopping criteria from the user is not shown.

Thus, a set of input parameters is swept for multiple sets of values of their potential inputs over multiple compilations of a circuit design.

At step 116, at least one compilation that generates an optimum value of the output metric is identified (e.g., the maximum value of $F_{max}$ or fewest failing paths). The optimum value can be identified in numerous ways such as through a textual output or a graphical format displaying changes in the output metric as it is swept over different seed values. Alternatively, the desired or constrained value for the output metric can be identified by the user and treated as a target for the method. $F_{max}$ is a common output metric; however, the present invention includes any output metric or combination of output metrics.

In the process of FIG. 1, software of the present invention automatically varies the seed and other input parameter values in each compilation. Each compilation is performed automatically using seed and input parameters values that are selected by the software. This process dramatically reduces the user time required to manually enter a new seed and input values and manually initiate each compilation. The present invention allows input parameters and seed to be automatically swept over many different values without requiring manual user input. Thus, the present invention provides an efficient mechanism for identifying the values of input parameters that optimize values for selected output metrics.

Figure 2:
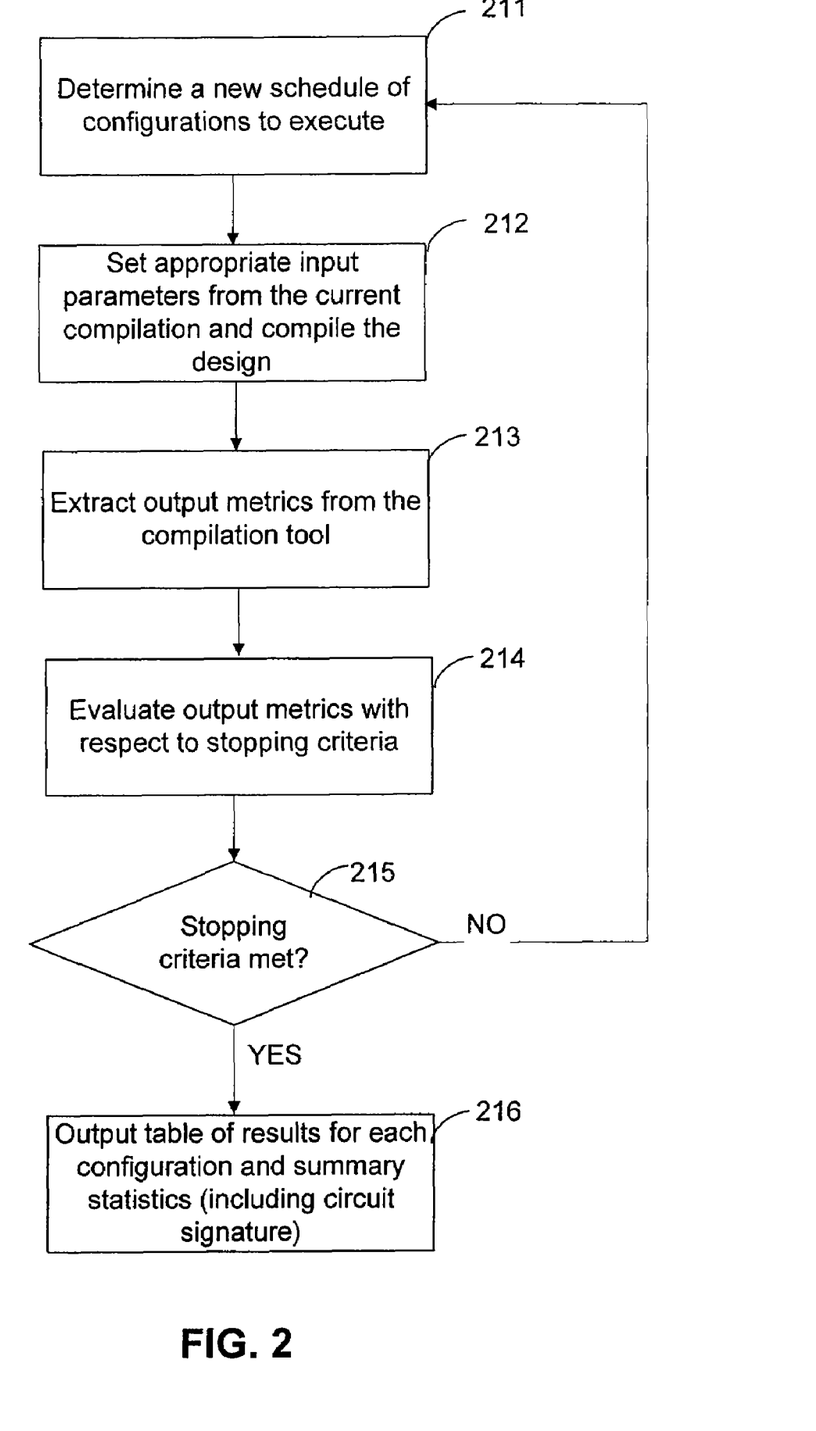
FIG. 2 shows a modification of the process of FIG. 1 wherein the order of configurations attempted is dynamically modified.

In a further embodiment shown in FIG. 2, the schedule of configurations is dynamically updated. Rather than returning to 212 as per the process of FIG. 1, the process returns to 211 and dynamically modifies the schedule. Steps 211-216 otherwise correspond to steps 111-116.

The process of FIG. 2 has the ability to compare the results of the output metrics against the stopping criteria and to modify the most appropriate of the input parameters. For example, if the current result is significantly different than the target, the process can modify a parameter that is expected to have large (but possibly worse) effects. Alternatively, if the results are close to the stopping criteria, the process can modify parameters that are expected to have small but more predictable results. The varying effects of these parameters are generally well known one who is skilled in the use of the compilation tool.

Figure 3A:
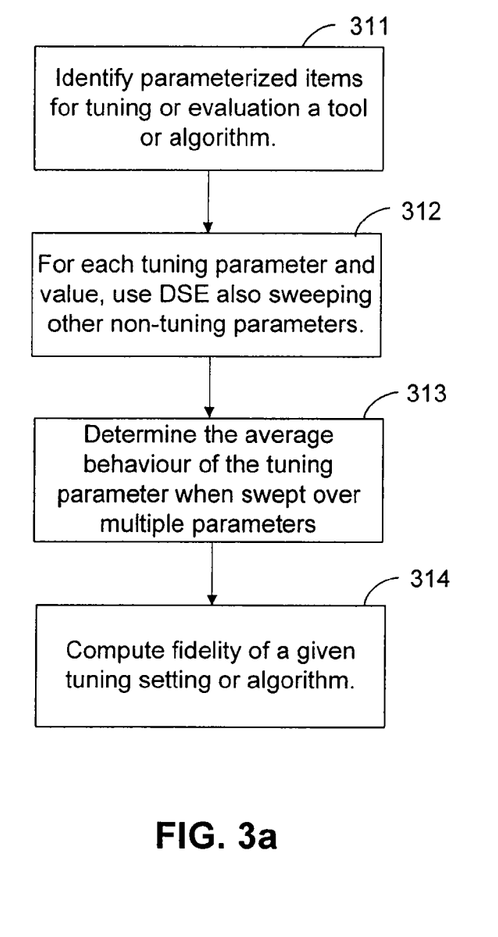
FIGS. 3A-3B illustrate the use of the process of FIG. 1 to effect more accurate specification of default input parameters in a CAD method.

In a further embodiment shown in FIG. 3A, a process of the present invention is used for an alternative application, namely to compute the default parameters or to examine the usefulness of a given exogenous method or algorithm. It is often the case that one default parameter setting appears better, when in fact this is simply due to random variation inherent in the heuristic solutions of NP-Hard problems.

In step 311, the process identifies the set of tuning parameters appropriate to a specific algorithm. It can also be appreciated that one such parameter is to use or not use this algorithm in the flow. In step 312, the process of FIG. 3A utilizes the process of FIG. 2 to sweep multiple other exogenous parameters in combination with the tuning parameters for the current algorithm. In step 313, the process calculates the distribution and average behavior of the tuning parameter in the sweeping process, therefore determining statistical confidence on the effect of the tuning parameters. In step, 314, the process computes the fidelity of a given tuning setting or algorithm.

Figure 3B:
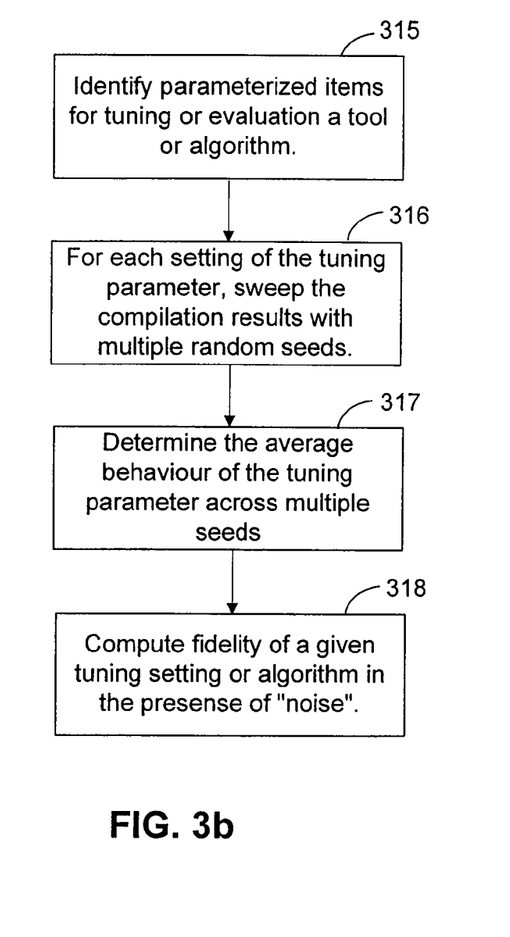

FIG. 3B shows a specific embodiment of FIG. 3A process in which the exogenous parameter is the initial placement of the circuit as determined by, for example, a random fitter seed. It can be appreciated that further statistical confidence can be achieved through the use of a larger number of example circuit designs, since the goal of this particular embodiment is to not be design specific.

In step 315, the process identifies parameterized items for tuning or evaluating a tool or algorithm. In step 316, the process sweeps the compilation results with multiple random seeds for each setting of the tuning parameter. In step 317, the process determines the average behavior of the tuning parameter across multiple seeds. In steps 318, the process computes the fidelity of a given tuning setting or algorithm in the presence of noise.

The example values in Table 1 can also be used to illustrate the embodiment of FIG. 1 or FIG. 2. In compilations 1, 5, and 9, the register packing parameter is ON, compilation time is 10, and the seed value varies. The average maximum frequency for these first three compilations is 79.7.

In compilations 2, 6, and 10, the register packing parameter is ON, compilation time is 20, and the seed value varies. The average maximum frequency for these second three compilations is 84.7.

The average maximum frequency for compilations 3, 7, and 11 is 78.3. Compilations 4, 8, and 12 are the last set of compilations performed. The average maximum frequency for these compilations is 84.

The compilation that produced the optimum average value for the output metric values is identified by the software or the user. The input values used to produce this compilation can be used to place and route the user circuit design on the FPGA with better overall results according to the designer's goals.

Using the example values from Table 1, the input parameter combination for compilations 2, 6, and 10 is identified, because setting register packing to ON and compilation time to 20 yields the greatest value for the maximum frequency.

The present invention can display or identify one optimum average value for an output metric or a range of average values for one or more output metrics. The values of multiple output metrics can be displayed in a chart or a graph to facilitate identification of the optimum output metric values. The output of the processes of FIG. 1 or FIG. 2 can illustrate how using different seed values affect the output metrics. According to one embodiment of the present invention, the user manually selects the best compilation for his purposes based on a range of output metric values. The best compilation selected by the user is referred to as the signature of a circuit design.

The present invention can display the results of the compilations to the user, and based on these results, a user can decide the preferred result. The results are persistent through small changes to the design. The user can get the results, and then use the selected input parameters for all future compilations as the user changes the design.

According to the processes of FIG. 1 or FIG. 2 one output of these processes is to provide the user with a signature of the design. The signature of the design includes one or more sets of signature values for the input parameters and output metric values corresponding to the signature input parameter values.

The signature values can be optimum values for the input parameters that satisfy user-defined criteria that is specific to the circuit design. Ideally, the signature values are persistent such that the one or more sets of signature values for the input parameters remain optimum even over minor changes to the design.

Because seed values are random, they are used as one possible input parameter to increase the maximum frequency or other metric by a small amount (randomly) in the embodiment of FIG. 1 or FIG. 2. In the other embodiments of present invention, multiple seed values can be test compiled to reduce "noise." Noise refers to the variance in the output metric values that are associated with any compilation.

Another embodiment of the present invention is referred to as space exploration. According to this embodiment, numerous test compilations are performed. During each test compilation, values are provided for several different input parameters.

The test compilations are grouped into subsets. In each subset of test compilations, the value of one of the input parameters is varied between compilations. The values of an output metric are averaged together for all the test compilations in the subset. These test compilations can be performed, for example, using either of the embodiments of FIG. 1 or FIG. 2.

The average output metric values for all of the subsets of compilations are compared with each other. One or more of the compilation subsets that produce the best output metric values are identified. This identification can be performed by a user or automatically according to predefined criteria.

A second set of compilations is then performed. The values of the input parameter that provided the best results in the first set of compilations are used to better target a range of values to be tested in the second set of compilations. The second set of compilations helps to more closely identify ranges of the selected input parameter that provide the best values for one or more output metrics. Additional sets of compilations can be performed to more closely identify optimum ranges of the selected input parameter values.

In an alternative implementation of FIG. 1 or FIG. 2, the computer system can display multiple values for each of the input parameters used in the compilations and corresponding output metrics in a graphical or chart format. The graph or chart illustrates the trade-offs between using different values for the input parameters in terms of their effects on the output metric values. By viewing the graph or chart, the user can determine which of the displayed values best satisfies his particular signature requirements for the circuit design.

Figure 4:
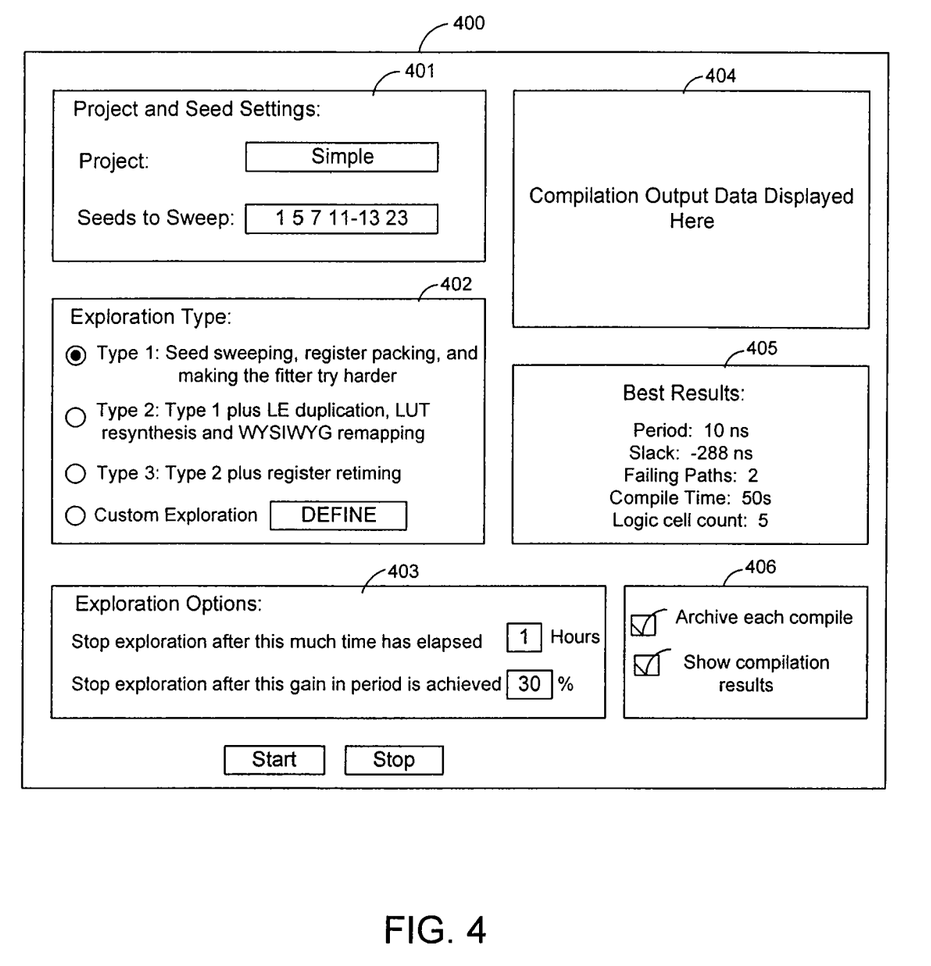
FIG. 4 illustrates an example of a user input interface that can be used with the techniques of the present invention.

FIG. 4 illustrates an example of a user input interface 400 that can be used with the techniques of the present invention. A user can enter a project name in interface region 401. The user can also enter numbers for the seeds to sweep in interface region 401. The user can select the type of exploration to be performed in the compilations in interface region 402. IN region 403, the user can select compilation time and a gain period. Output compilation data is displayed in region 404, and the best results for one or more output metrics are displayed in region 405. Other options are displayed in region 406.

It is not required that implementations of the present invention search all possible combinations of parameters. In an embodiment of the present invention, the process calculates statistics on the current circuit, and heuristically prunes alternatives from the exponential-sized search space. Available statistics include the number of registers in the circuit, characteristics of the critical path, current status with respect to the user constraints. In this embodiment, the tool automatically chooses which parameter to vary first based on known expectations of results. For example, one input parameter setting can have a large affect on results but also a high probability of failure, while another has a lesser effect but higher expectation of success. The former is more appropriate when the current status is far from the desired, and the latter when the current result is very close to the desired.

In one embodiment, the preceding structured search is combined with the user constraint for total compile time or number of compiles, and a static schedule of parameterizations is pre-computed. In a further embodiment, this schedule utilizes the current status of the known results and is thus dynamic. This latter embodiment is illustrated in FIG. 2.

While the various techniques described above apply generally to many different types of integrated circuits, they are particularly suitable for FPGAs. Today's high-density FPGAs are not only used to implement custom logic with the characteristic quick turn-around, they provide resources that allow them to implement system solutions for the networking, wireless and general high-bandwidth telecommunication applications. FPGAs are also more likely than ASIC designs to be repeatedly compiled, due partly to the density space they occupy, but also due to the nature of logic which is common FPGAs.

Figure 5:
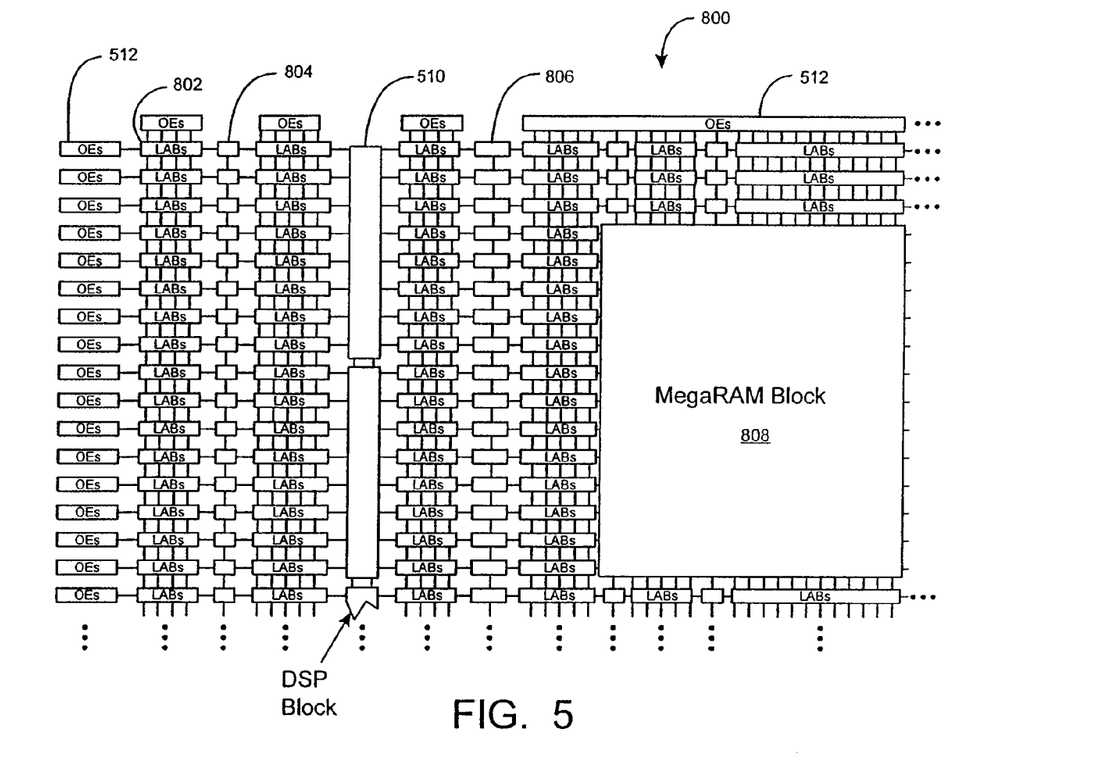
FIG. 5 is a simplified block diagram of a FPGA that can be test compiled according to embodiments of the present invention.

FIG. 5 is a simplified partial block diagram of an exemplary high-density FPGA 800 that can be test compiled according to the principles of the present invention. FPGA 800 includes a two-dimensional array of programmable logic array blocks (or LABs) 802 that are interconnected by a network of column and row interconnects of varying length and speed. LABs 802 include multiple (e.g., 10) logic elements (or LEs), an LE being a small unit of logic that provides for efficient implementation of user defined logic functions.

FPGA 800 also includes a distributed memory structure including RAM blocks of varying sizes provided throughout the array. The RAM blocks include, for example, 512 bit blocks 804, 4K blocks 806 and a MegaBlock 508 providing 512K bits of RAM. These memory blocks may also include shift registers and FIFO buffers. FPGA 800 further includes digital signal processing (DSP) blocks 510 that can implement, for example, multipliers with add or subtract features. I/O elements (IOEs) 512 located, in this example, around the periphery of the device support numerous single-ended and differential I/O standards. It is to be understood that FPGA 800 is described herein for illustrative purposes only and that the present invention can be implemented in many different types of PLDs, FPGAs, and the like.

Figure 6:
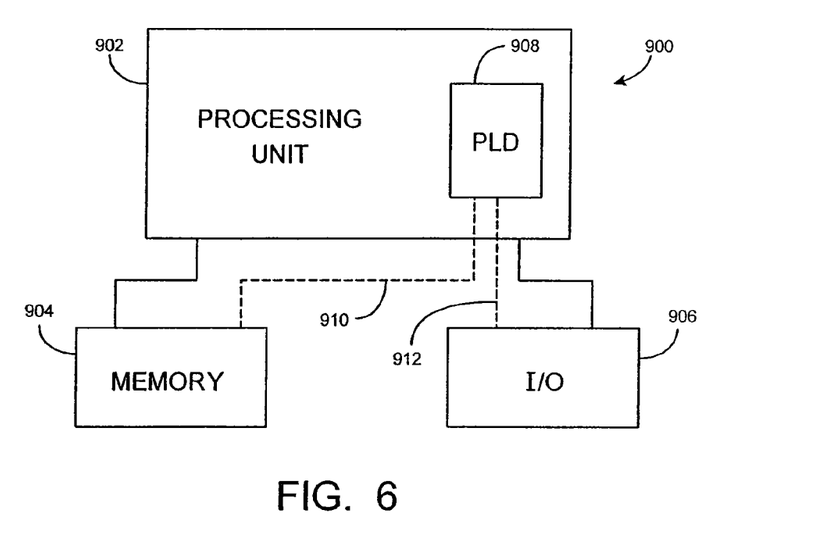
FIG. 6 is a block diagram of an electronic system that can be implemented using techniques of the present invention.

FIG. 6 shows a block diagram of an exemplary digital system 900, within which the present invention may be embodied. System 900 may be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 900 may be provided on a single board, on multiple boards, or within multiple enclosures.

System 900 includes a processing unit 902, a memory unit 904 and an I/O unit 906 interconnected together by one or more buses. According to this exemplary embodiment, a programmable logic device 908 is embedded in processing unit 902. PLD 908 may serve many different purposes within the system in FIG. 4. PLD 908 may, for example, be a logical building block of processing unit 902, supporting its internal and external operations. PLD 908 is programmed to implement the logical functions necessary to carry on its particular role in system operation.

PLD 908 may be specially coupled to memory 904 through connection 910 and to I/O unit 906 through connection 912. Processing unit 902 may direct data to an appropriate system component for processing or storage, execute a program stored in memory 904 or receive and transmit data via I/O unit 906, or other similar function. Processing unit 902 may be a central processing unit (CPU), microprocessor, floating point coprocessor, graphics coprocessor, hardware controller, microcontroller, programmable logic device programmed for use as a controller, network controller, and the like.

Furthermore, in many embodiments, there is often no need for a CPU. For example, instead of a CPU, one or more PLDs 908 may control the logical operations of the system. In an embodiment, PLD 908 acts as a reconfigurable processor, which can be reprogrammed as needed to handle a particular computing task. Alternately, programmable logic device 908 may itself include an embedded microprocessor. Memory unit 904 may be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method in a computer system for compiling a design for an integrated circuit, the method comprising:
   performing multiple compilations of the design, each compilation comprising:
      placing and routing the design on the integrated circuit; and
      performing a timing analysis on the placed and routed design;
   each compilation using a set of input parameters, each input parameter having a value from a series of automatically selected values;
   each compilation using the timing analysis to generate output values for an output metric of the placed and routed design;
   concluding the compilations when a stopping criterion has been reached;
   for each group of compilations having a common value for an input parameter, calculating an average output value for the output metric;
   selecting the group having an optimum average output value; and
   using the common value for the input parameter for the selected group to compile the design on the integrated circuit.

2. The method according to claim 1 further comprising: receiving a selection of the optimum average output value from a user.

3. The method according to claim 1 wherein:
   one of the input parameters is a random seed or initial configuration parameter.

4. The method according to claim 1 wherein:
   one of the input parameters is effort level for the compilation tool or a portion of the compilation tool.

5. The method according to claim 1 wherein:
   the output metric comprises a minimum slack calculated on the integrated circuit.

6. The method according to claim 1 wherein:
   the output metric comprises a total slack calculated on the integrated circuit.

7. The method according to claim 1 wherein:
   the stopping criterion is based on achieving a user's specified constraints.

8. The method according to claim 1 wherein:
   each output value of the group is associated with a different random seed value while all other input values remain constant.

9. The method according to claim 1 wherein:
   the stopping criterion is based on achieving a minimum worst-case slack in the integrated circuit.

10. The method according to claim 1 wherein:
    the stopping criterion is based on a total slack in the circuit.

11. The method according to claim 1 wherein:
    the optimum average output value is selected using software.

12. The method according to claim 1 further comprising displaying the compilations.

13. The method according to claim 1 wherein compiling the design further comprises converting a behavioral description to a netlist.

14. The method according to claim 1 wherein the stopping criteria has been reached when the output metric indicates that the design has been placed and routed using less than a specific amount of resources.

15. The method according to claim 1 wherein the stopping criteria has been reached when the output metric indicates that an acceptable delay through a signal path was measured during the timing analysis.

16. A computer system for automating compilation of a design for an integrated circuit, the method comprising:
    code for performing multiple compilations of the design, each compilation comprising:
       placing and routing the design on the integrated circuit; and
       extracting one or more output metrics from the placed and routed design;
    each compilation using a set of input parameters for the design, each compilation using a different series of automatically selected values for the set of input parameters;
    code for concluding the compilations when a stopping criterion has been reached;
    code for calculating an average output value for each of the one or more output metrics for each group of compilations having a common value for an input parameter;
    code for selecting the group having an optimum average output value; and
    code for using the common value for the input parameter for the selected group to compile the design on the integrated circuit.

17. The computer system according to claim 16 wherein each output value of the group is associated with a different random seed value while all other input values remain constant.

18. The computer system according to claim 16 wherein:
    one of the input parameters is a random seed or initial configuration parameter.

19. The computer system according to claim 16 wherein:
    one of the input parameters is effort level for the compilation tool or a portion of the compilation tool.

20. The computer system according to claim 16 wherein:
    the output metrics include a total slack and a minimum slack calculated on the integrated circuit.

21. The computer system according to claim 16 wherein:
    the stopping criterion is based on one of achieving a user's specified constraints, a number of failed constraints in the integrated circuit, a total slack in the circuit, and achieving a minimum worst-case slack in the integrated circuit.

22. The computer system according to claim 16 further comprising code for displaying the compilations.

23. The computer system according to claim 16 wherein:

an order of configurations is dynamically modified based on a metric of current distance from a user's specified constraint.

24. The computer system according to claim 16 wherein the one or more output metrics are extracted during a timing analysis.

25. A method in a computer system of compiling a design for an integrated circuit comprising:

performing a plurality of compilations of the design by:

receiving a set of input parameters for the design;

automatically selecting a series of values for each input parameter;

selecting a value in the series of values for each input parameter;

compiling the design using the selected values for the input parameters, wherein compiling the design comprises:

placing and routing the design on the integrated circuit; and extracting an output metric from the placed and routed design;

using a value of the output metric to determine whether a stopping criteria has been reached; and if the stopping criteria has not been reached, then performing another compilation in the plurality of compilations of the design by selecting another value in the series of values for each input parameter, otherwise using values for output metrics generated by the plurality of compilations to select at least one of the plurality of compilations;

determining at least one value for one input parameter used during the selected at least one compilation; and using the at least one input value to compile the design on the integrated circuit.

26. The method of claim 25 wherein compiling the design further comprises converting a behavioral description to a netlist.

27. The method of claim 25 wherein determining whether the stopping criteria has been reached comprises determining that the output metric indicates that the design has been placed and routed using less than a specific amount of resources.

28. The method of claim 25 wherein extracting the output metric from the placed and routed design comprises performing a timing analysis on the placed and routed design.

29. The method of claim 28 wherein determining whether the stopping criteria has been reached comprises determining that the output metric indicates that an acceptable delay through a signal path was measured during the timing analysis.

30. The method of claim 25 wherein the extracted output metric indicates the amount of resources used by the compilation.

31. The method of claim 25 wherein the extracted output metric comprises a delay through a signal path.

* * * * *